United States Patent [19]
Liu

[11] Patent Number: 6,163,789
[45] Date of Patent: Dec. 19, 2000

[54] DIGITAL PARAMETRIC EQUALIZER WITH SYMMETRICAL CUT AND BOOST SPECTRUMS

[75] Inventor: Jianxin Liu, Mountain View, Calif.

[73] Assignee: Oak Technology, Inc., Sunnyvale, Calif.

[21] Appl. No.: 09/195,295

[22] Filed: Nov. 18, 1998

[51] Int. Cl.[7] .................................................. G06F 17/10
[52] U.S. Cl. ............................................. 708/323; 708/300
[58] Field of Search .................................... 708/323, 300, 708/303, 318, 320; 375/229–236

[56] References Cited

U.S. PATENT DOCUMENTS

| | | | |
|---|---|---|---|
| 5,737,254 | 4/1998 | Lane et al. | 708/323 |
| 6,003,051 | 12/1999 | Okazaki | 708/300 |

OTHER PUBLICATIONS

Massie, An Engineering Study of the Four–Multiply Normalized Ladder Filter, Journal of Audio Engineering Society, vol.7/8, Jul./Aug. 1993, pp. 564–582.

*Primary Examiner*—Tan V. Mai
*Attorney, Agent, or Firm*—Pennie & Edmonds LLP

[57] ABSTRACT

An improved digital parametric equalizer realized by software stored in a computer readable memory. The computer readable memory stores a first and a second set of instructions. The first set of instructions determines a value of a tuning coefficient based upon whether a parametric equalizer is to cut or to boost an input signal. The second set of instructions implements a filter to realize the parametric equalizer. The second set of instructions uses the value of the tuning coefficient and the input signal to produce an output signal having substantially symmetrical cut and boost spectrums.

14 Claims, 10 Drawing Sheets

DIGITAL PARAMETRIC EQUALIZER WITH SYMMETRICAL CUT AND BOOST SPECTRUMS

FIELD OF THE INVENTION

The present invention relates generally to digital audio systems. In particular, the present invention relates to a digital audio system utilising a digital parametric equalizer with symmetrical cut and boost spectrums.

BACKGROUND OF THE INVENTION

A second-order digital all-pass filter implementation of a parametric audio equalizer is described in: Massie, *An Engineering Study of the Four-Multiply Normalized Ladder Filter*, Journal of Audio Engineering Society, vol. 7/8, July/August 1993. The transfer function of Massie's four-multiply normalized ladder filter is given by Relationship 1.

$$F(z)=[1+A(z)]/2+G[1-A(z)]/2 \qquad (1)$$

where:
  G is the cut/boot parameter; and
  and A(z) is described by Relationship 2.

$$A(z)=(z^{-2}+k_1(1+k_2)z^{-1}+k_2)/(1+k_1(1+k_2)z^{-1}+k_2z^{-2}) \qquad (2)$$

where:
  $k_1$ is the equalizer's first tuning coefficient;
  $k_2$ is the equalizer's second tuning coefficient; and
  $z^{-1}$ represents a unit delay.

The values of the first and second tuning coefficients can be calculated given values for the equalizer parameters: center frequency and bandwidth.

$$k_1=\cos(2\pi F_c/F_s) \qquad (3)$$

$$k_2=(1-\tan(\pi F_c/(F_sQ)))/(1+\tan(\pi F_c/(F_sQ)) \qquad (4)$$

where:
  $F_c$ is center frequency;
  $F_s$ is sampling frequency; and
  Q is a quality factor given by $F_c$/Bandwidth.

FIG. 1 is a signal flow diagram for a four-multiply normalized ladder filter for implementing the parametric equalizer transfer function of Relationship 1. This implementation introduces two filter coefficients, $c_1$ and $c_2$, whose values are defined by Relationships 5 and 6.

$$c_1=\sqrt{(1-k_1^2)} \qquad (5)$$

$$c_2=\sqrt{(1-k_2^2)} \qquad (6)$$

FIG. 1 also indicates the values at various internal nodes, $w_1$, $w_2$, $w_3$, $w_4$ and $w_5$, within the ladder filter.

Given the signal flow diagram of FIG. 1 and a digital signal processor(DSP), software instructions to implement the four-multiply ladder filter can readily be generated by one of ordinary skill in the art. Massie discloses one set of possible instructions to do so in his paper.

FIG. 2 illustrates the cut and boost spectrums of an implementation of Massie's four-multiply ladder filter. Note that the cut and boost spectrums are not symmetrical; nor are the cut and boost bandwidths identical. The cut bandwidth is approximately 1500 Hz as compared to the boost bandwidth of 2000 Hz. This unexpected spectrum asymmetry during cut and boost is undesirable for audio applications. One reason this asymmetry is undesirable is because it limits the ability of the ladder filter to filter out undesired frequencies, like the higher order harmonics generated by AC power supplies.

Thus, it would be highly desirable to provide a digital audio system with improved audio quality. In particular, it would be highly desirable to provide a digital parametric equalizer with substantially symmetrical cut and boost spectrums.

SUMMARY OF THE INVENTION

Briefly described, the present invention is an improved digital parametric equalizer implemented with a computer readable memory. The computer readable memory stores a first and second set of instructions. The first set of instructions determines a value of a tuning coefficient based upon whether a parametric equalizer is to cut or to boost an input signal. The second set of instructions implements a filter to realize the parametric equalizer. The second set of instructions takes the tuning coefficient and the input signal to produce an output signal having substantially symmetrical cut and boost spectrums.

Other objects, features, and advantages of the present invention will be apparent from the accompanying drawings and detailed description that follows.

BRIEF DESCRIPTION OF THE DRAWINGS

The present invention is illustrated by way of example and not by way of limitation in the figures of the accompanying drawings. In the accompanying drawings similar references indicate similar elements.

DETAILED DESCRIPTION OF THE INVENTION

Figure 3:
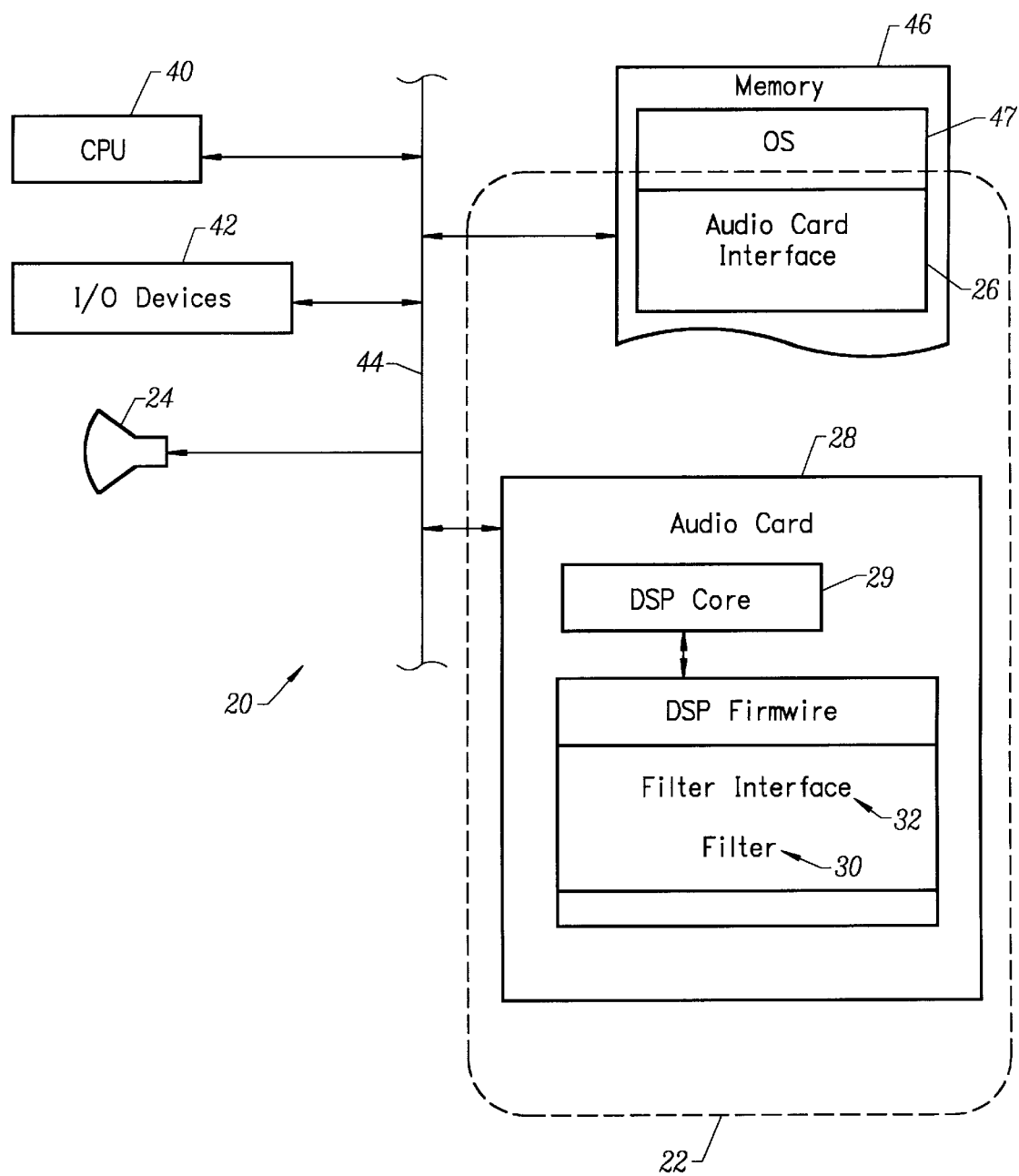
FIG. 3 illustrates, in block diagram form, the computer system in which the present invention operates.
Figure 9:
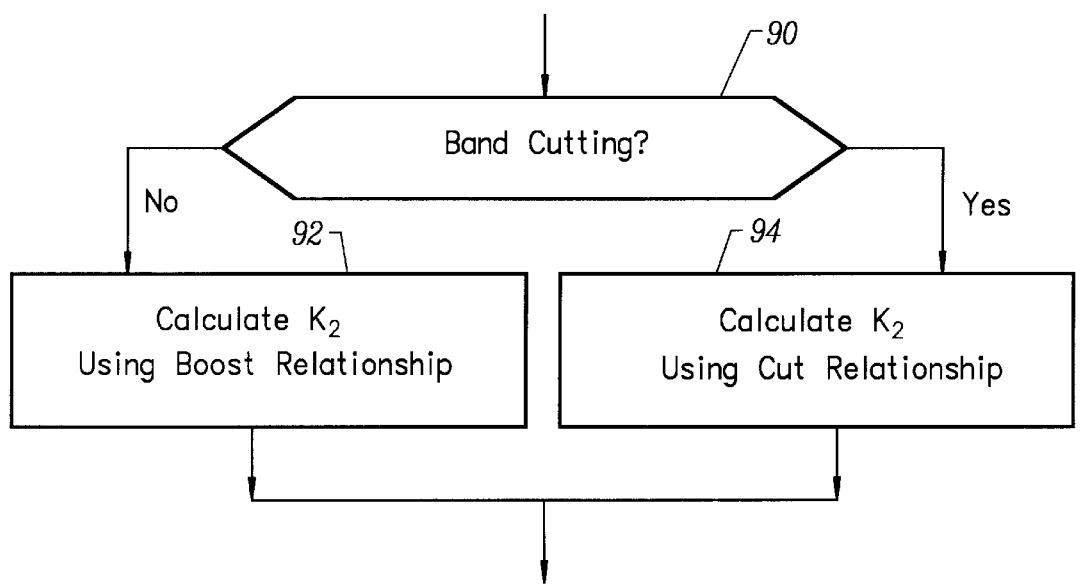
FIG. 9 illustrates the instructions for insuring symmetrical cut and boost spectrums in accordance with an embodiment of the present invention.

FIG. 3 illustrates in block diagram form computer system 20, which includes audio system 22 for improving the sound quality of speaker 24. Audio system 22 includes an improved digital parametric audio equalizer of the present invention, which is realized using a number of four-multiply normalized ladder filters 30. Unlike prior digital filters, filter 30 produces symmetrical cut and boost spectrums. This spectrum symmetry is produced by using two different Relationships to calculate the second tuning coefficient, $k_2$. AudioCard Interface 26 determines which of the two equations to use based upon the value of the cut/boost parameter of the parametric equalizer. In accordance with known techniques, AudioCard Interface 26 also calculates other relevant information and routes that information to filter 30. The improved digital parametric equalizer of the present invention will be described in greater detail with respect to FIGS. 5, 7 and 9. In one embodiment, the present invention allows real-time modification of equalizer parameters. This embodiment will be described in greater detail with respect to FIG. 10.

Prior to a more detailed discussion of the improved digital parametric equalizer of the present invention, first consider FIG. 3 and the context in which the present invention operates. Computer system 20 includes Central Processing Unit (CPU) 40 that communicates with a set of input/output devices 42 over system bus 44. System bus 44 is a Universal System Bus (USB). Input/output devices 42 include a keyboard, mouse, video monitor, printer, etc (not illustrated). CPU 40 controls and coordinates the operations of computer system 20 by executing instructions stored in machine readable form in memory 46. Those instructions include Operating System (OS)47 and AudioCard Interface 26. The interactions between CPUs 40, input/output devices 42, system buses 44, and memories 46 are known in the art.

A. Overview of the Audio System

Still referring to FIG. 3, computer system 20 also includes speaker 24, enabling system 20 to play music CDs. There are a number of commercially available speakers, including, for example, the LCS-150 produced by LABTAC of Vancouver, Wash., and the SB-881A produced by Pontech of Taiwan. Speaker 24 maybe a USB speaker, able to identify its type to system 20. Each commercially available speaker has a different frequency response; however, none of them produces the sound quality most consumers have come to expect. Audio system 22 improves the perceived sound quality of speaker 24 by implementing the improved digital parametric equalizer of the present invention. Audio system 22 does so using AudioCard Interface 26 and Audio Card 28.

Figure 4:
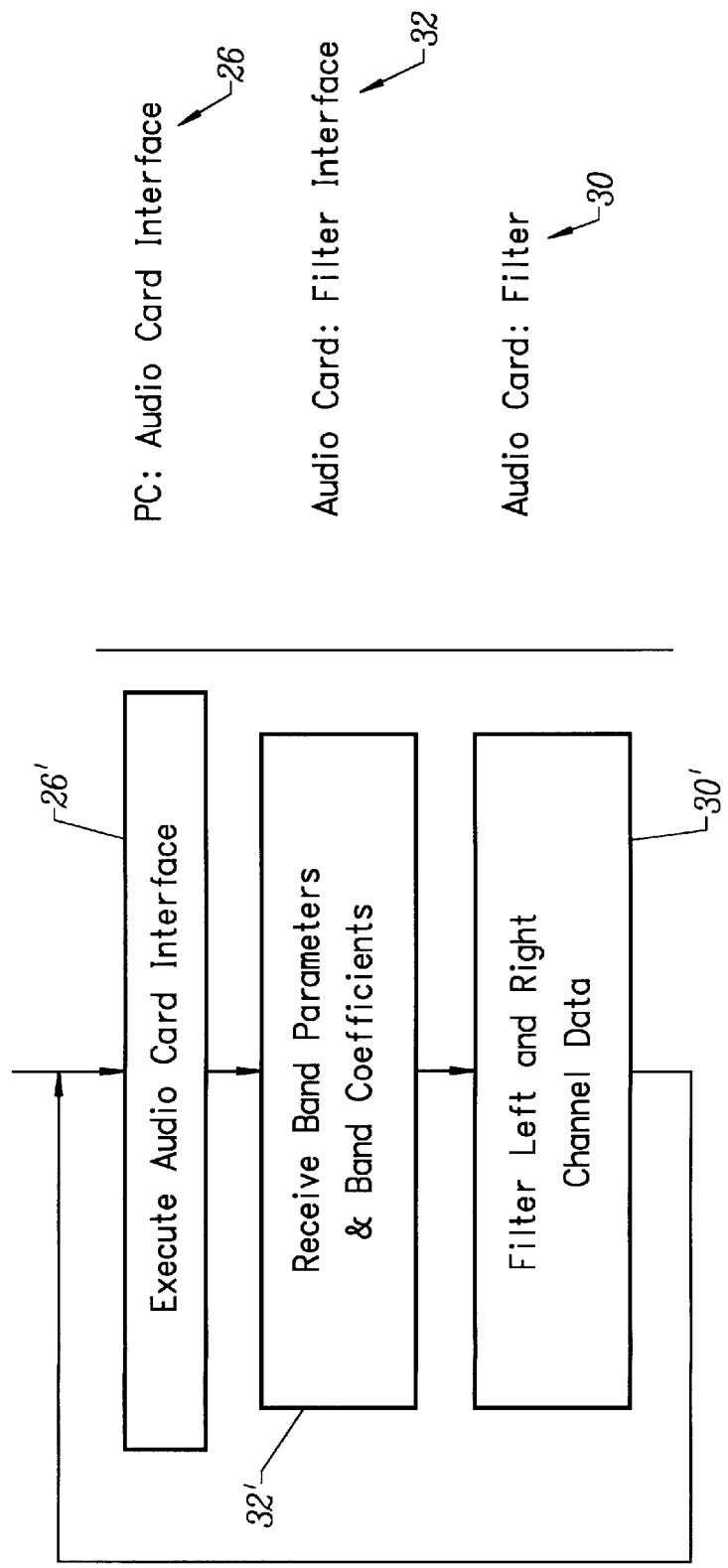
FIG. 4 illustrates the inter-relationship of the software modules of the present invention.

FIG. 4 illustrates the interaction between AudioCard Interface 26, and Filter Interface 32 and Filter 30 of Audio Card 28 and their order of execution. The text on the left hand side of FIG. 4 briefly describes the function of each module, while the text on the right hand side of FIG. 4 identifies which device executes each module 26, 30 and 32. AudioCard Interface 26 provides parameters for the parametric equalizer and uses these to calculate tuning and filter coefficients. AudioCard Interface 26 includes a user interface that allows a computer user to modify equalizer parameters, if desired. In the absence of user input, Audio-Card Interface 26 provides default parameter values. Audio-Card Interface 26 insures symmetrical cut and boost spectrums for each filter by using two different Relationships to calculate the second tuning coefficient, $k_2$. AudioCard Interface 26 selects between the two Relationships based upon the value of the cut/boost parameter. AudioCard Interface 26 then couples $k_2$ and other relevant information to Audio Card 28.

AudioCard 28 includes Filter Interface 32 and Filter 30. Filter Interface 32 accepts information for AudioCard 28 and insures the continued operation of Filter 30 when real-time changes are allowed to be made to equalizer parameter values. Filter 30 takes the information provided by Filter Interface 32 and instantiates as many four-multiply normalized ladder filters as required by the improved digital parametric equalizer of the present invention.

B. The Parametric Equalizer and Improved Ladder Filter

Figure 5:
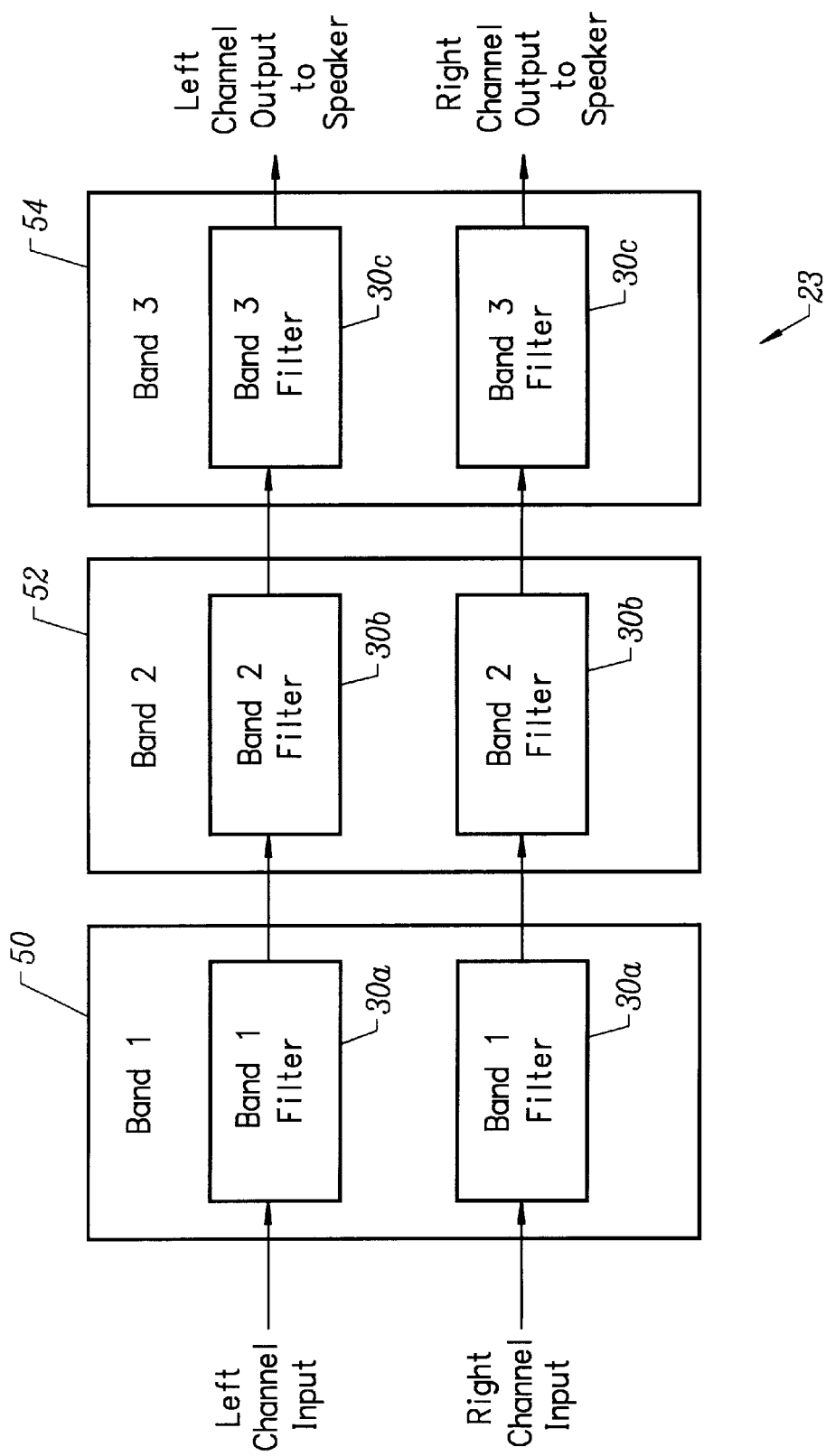
FIG. 5 illustrates in block diagram form the improved digital parametric equalizer of the present invention.

FIG. 5 illustrates in block diagram form improved digital parametric equalizer 23 of the present invention. As illustrated, equalizer 23 has three serially coupled equalizer bands, band1 50, band2 52 and band3 54. (Equalizer 23 can easily be modified to include a greater or lesser number of bands consistent with the present invention.) Each equalizer band 50, 52, and 54 includes two identical filters 30, one for each channel of audio data. In other words, the filters 30 of a band share the same values for equalizer parameters, $F_c$, Q, G and their derivatives, $k_1$, $k_2$, $c_1$ and $c_2$.

Each filter 30 is similar, but not identical, to the prior four-multiply normalized ladder filter discussed above. Specifically, filter 30 uses the signal flow diagram of FIG. 1, the transfer function of Relationship 1, the first turning coefficient of Relationship 3, the first filter coefficient of Relationship 5 and the second filter coefficient of Relationship 6. Despite these similarities between filter 30 and the prior art filter, each equalizer band 50, 52 and 54 produces an output signal with symmetrical cut and boost spectrums. This performance gain arises from the present invention's understanding and use of the second tuning coefficient, $k_2$. Analysis revealed that the second tuning coefficient, $k_2$, caused the asymmetry between cut and boost spectrums produced by prior art devices. Further analysis revealed that a filter's cut and boost spectrums could be made symmetrical using one Relationship for $k_2$ while boosting and using another Relationship for $k_2$ while cutting. These conditions are described by Relationships 7 and 8.

$$k_2 = (1 - \tan(\pi F_c/(F_s Q)))/ (1 + \tan(\pi F_c/(F_s Q)) \text{ for } G \geq 1 \qquad (7)$$

$$k_2 = (G - \tan(\pi F_c/(F_s Q)))/ (G + \tan(\pi F_c/(F_s Q)) \text{ for } 0 < G < 1 \qquad (8)$$

Note that Boost Relationship 7 is identical to the prior Relationship 4; however, unlike Relationships 4 and 7, Cut Relationship 8 includes as a variable the cut/boost parameter, G.

Figure 1:
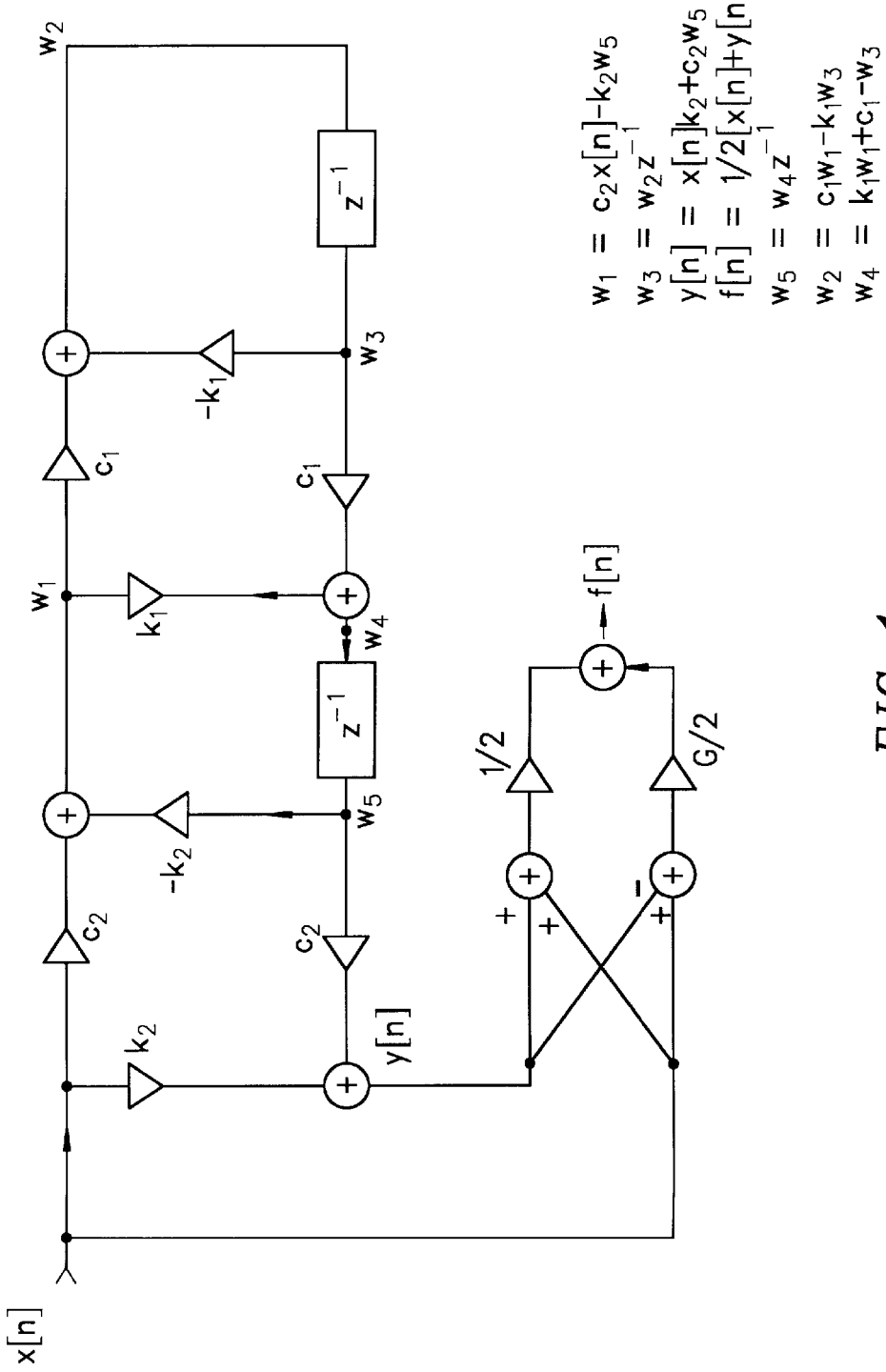
FIG. 1 is a signal flow diagram for a prior art four-multiply normalized ladder filter.

Implementing parametric audio equalizer 23 and filter 30 using a DSP chip, the relationships set forth above and the signal flow diagram of FIG. 1 will be obvious to one of ordinary skill in the art.

Figure 2:
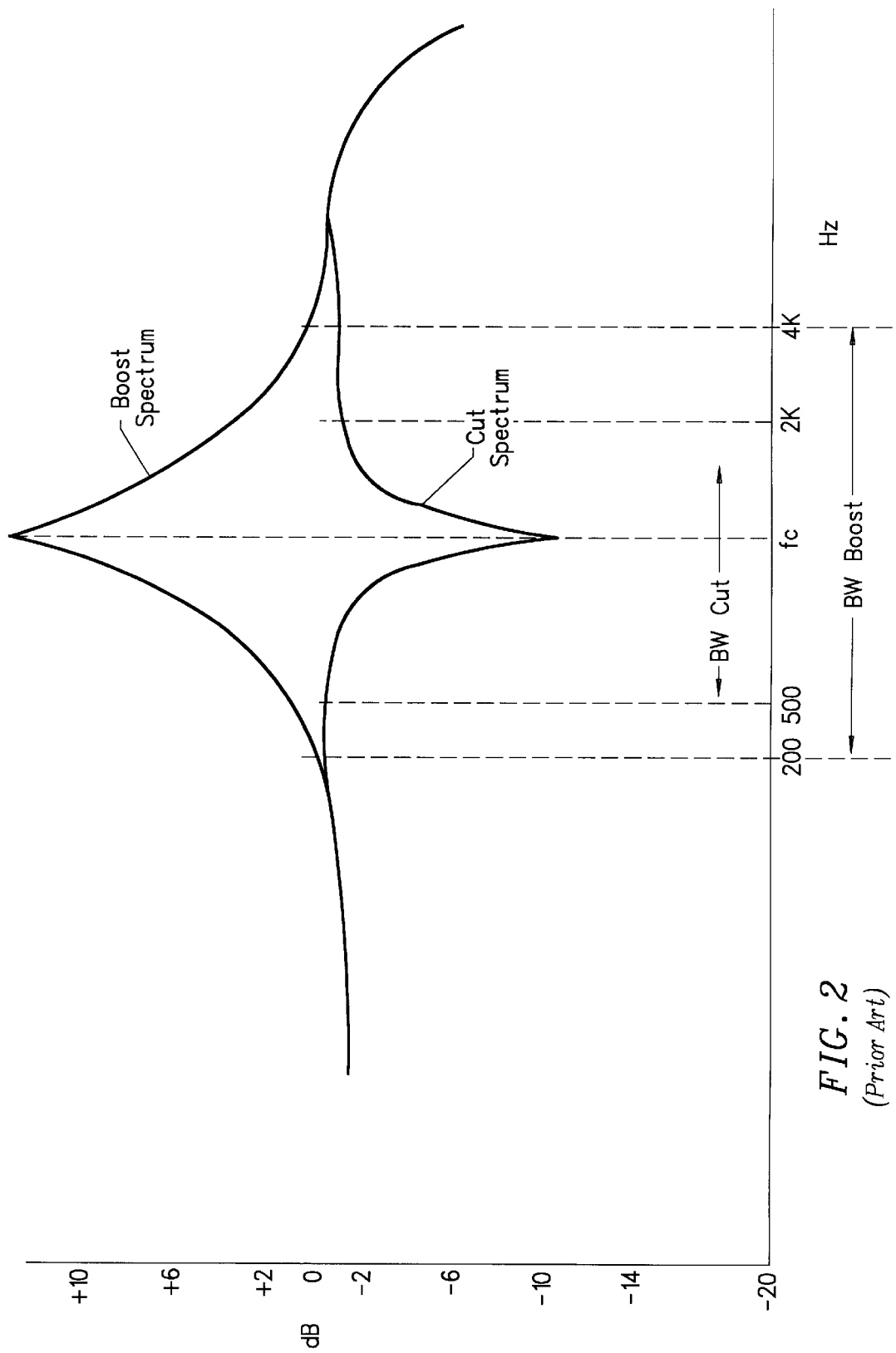
FIG. 2 illustrates the cut and boost spectrum of the prior art four-multiply normalized ladder filter.
Figure 6:
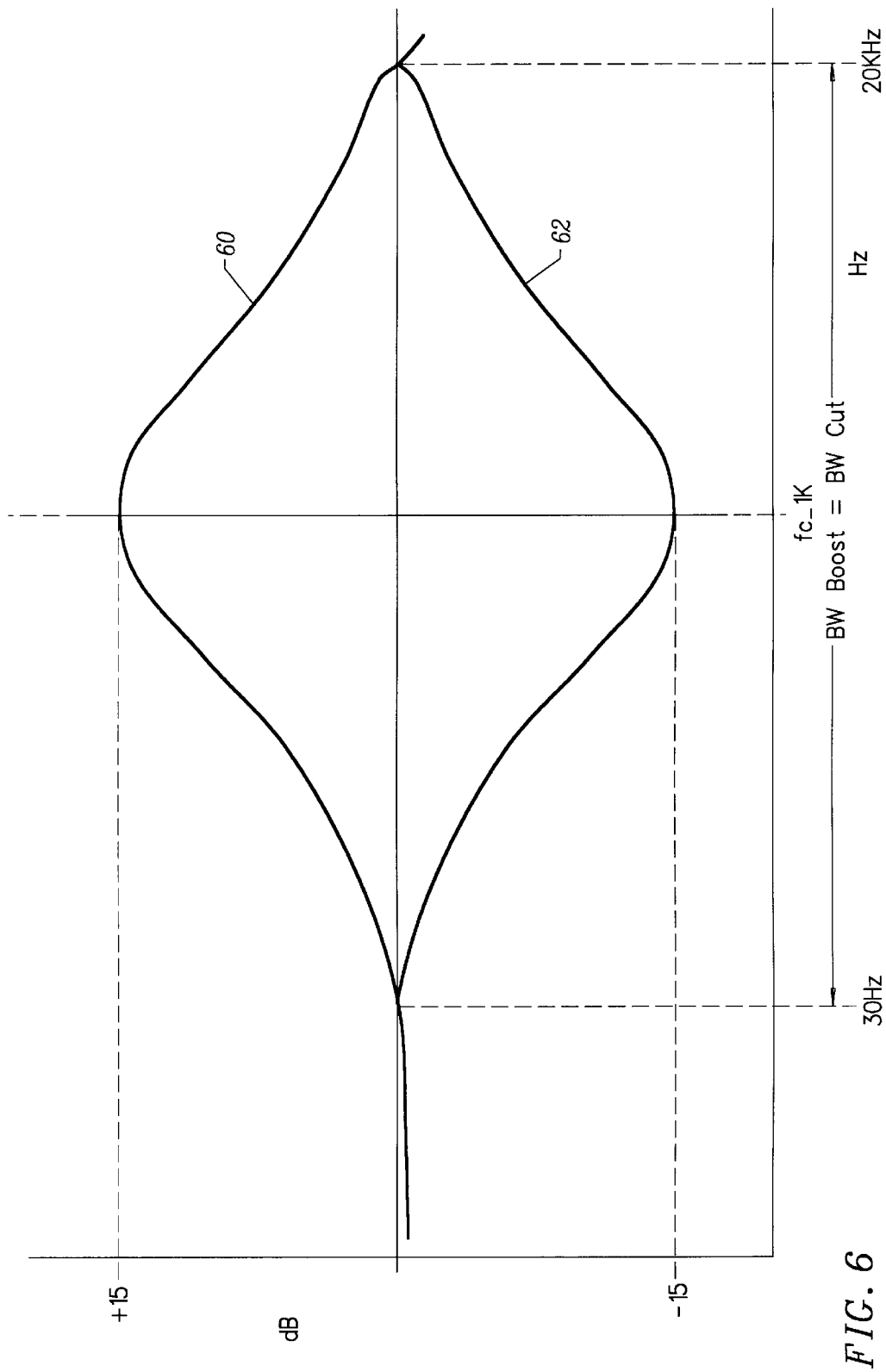
FIG. 6 illustrates the cut and boost spectrum of an instance of the improved four-multiply normalized ladder filter of the present invention.

FIG. 6 illustrates the frequency response of a filter implemented using Relationships 7 and 8 for $k_2$. Note the symmetry between boost spectrum 60 and cut spectrum 62, especially as compared to the cut and boost spectrums of FIG. 2. Note also that in FIG. 6 the boost bandwidth is equal to the cut bandwidth. Thus, the improved digital parametric equalizer of the present invention more closely approximates ideal equalizer performance and can more deeply notch out undesired frequencies than prior digital parametric equalizers.

C. The AudioCard Interface

Figure 7:
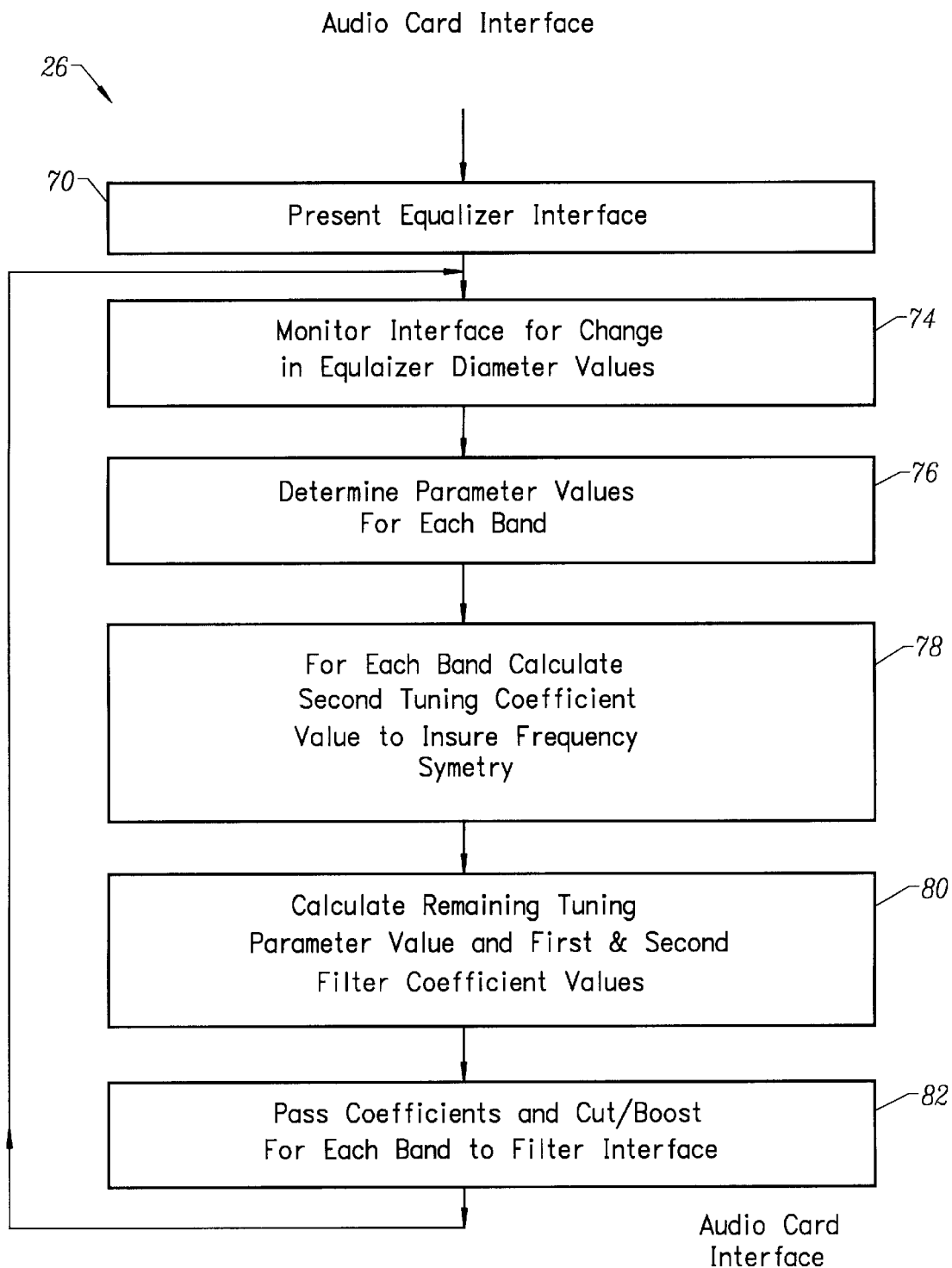
FIG. 7 is a flow diagram of the instructions of the AudioCard Interface module.

FIG. 7 illustrates in flow diagram form the instructions of AudioCard Interface 26. Instructions 26, as well as all other instructions discussed herein, may be realized in any computer language, including C++. Instructions 26 are stored within memory 46 and executed by CPU 40. Briefly described, AudioCard Interface 26 obtains equalizer parameters and uses these to calculate tuning coefficients and filter coefficients for each band 50, 52, and 54 of digital parametric equalizer 23. AudioCard Interface 26 does so in a manner that insures the symmetry of the cut and boost spectrums of each filter.

Figure 8:
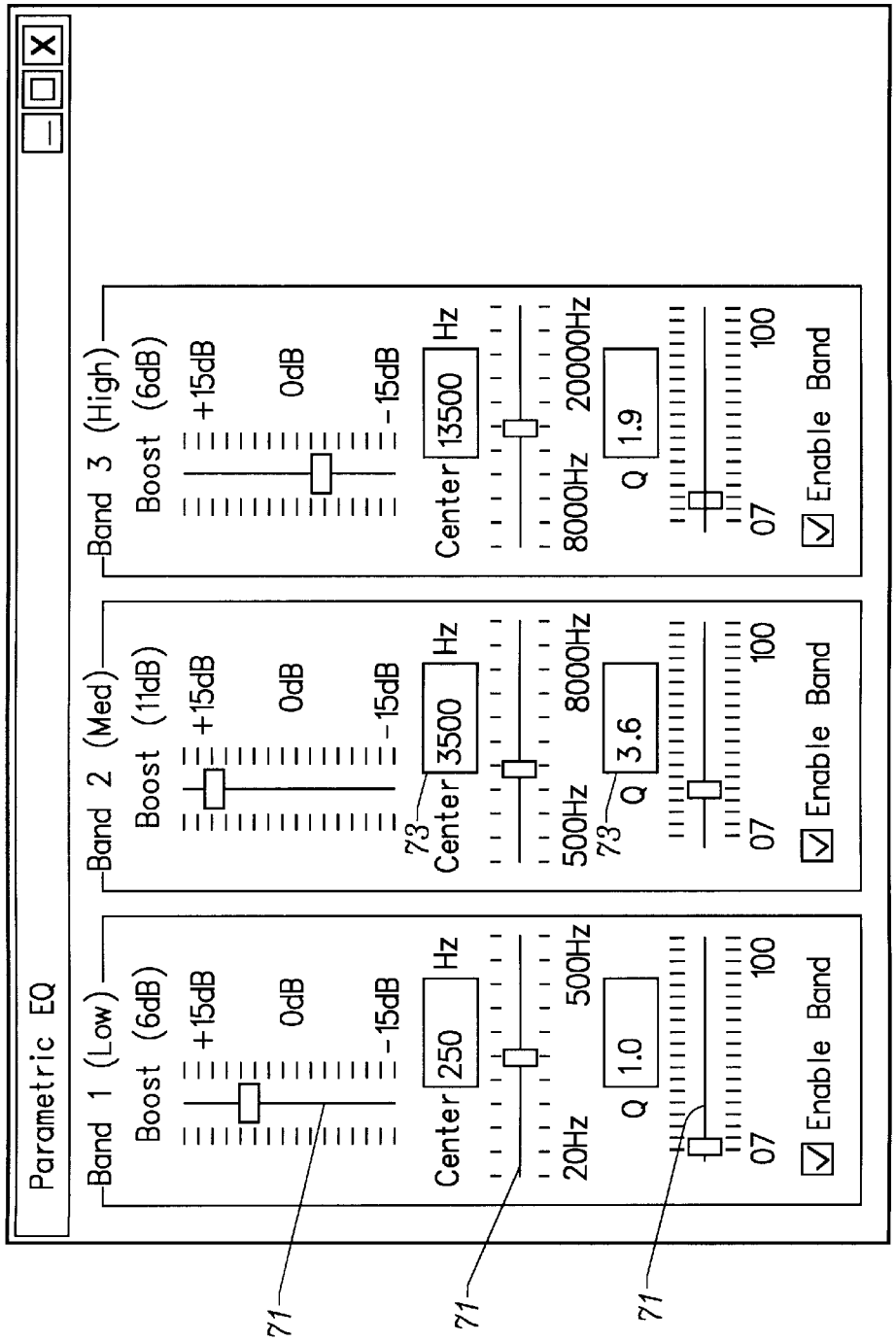
FIG. 8 illustrates one possible implementation of an equalizer user interface.

AudioCard Interface 26 begins by presenting an equalizer interface to a computer user during step 70. The equalizer interface allows the computer user to modify the equalizer parameters for each band. FIG. 8 illustrates one possible implementation of the equalizer interface, graphical user interface 72, which resembles a conventional analog equalizer. Other implementations of the equalizer interface are compatible with the present invention and need not be described in detail herein. After presenting the equalizer interface, during step 74 AudioCard Interface 26 monitors the equalizer interface for any indication that the user is modifying any parameter. For example, moving a slider bar 71 or selecting an input window 73 both indicate a possible alteration of a band's parameter values. In response, during step 76 AudioCard Interface 26 examines slider bar positions and input windows to determine each band's current parameters.

Given each band's current parameter values, AudioCard Interface 26 calculates the values of the tuning coefficients and filter coefficients for each band. During step 78 AudioCard Interface 26 calculates for each band its second tuning coefficient value, $k_2$, in a manner that insures symmetry of the cut and boost spectrum. To do this, during step 78 AudioCard Interface 26 executes instructions 79 of FIG. 9 once for each band. First, during step 90 for the selected band AudioCard Interface 26 examines the value of the cut/boost parameter to determine whether that band is to cut or boost its input signal. If the value of the cut/boost parameter is equal to one or greater, the band will be boosting, which causes AudioCard Interface 26 to use a Boost Relationship to calculate the second tuning coefficient, $k_2$. The Boost Relationship used during step 92 is Relationship 7, set forth above. On the other hand, if the value of the band's cut/boost parameter is less than one, then during step 94 AudioCard Interface 26 uses a Cut Relationship to calculate the value of the second tuning coefficient, $k_2$. The Cut Relationship used during step 94 is Relationship 8, also set forth above.

Having calculated the value for the second tuning coefficient, $k_2$, AudioCard Interface 26 advances to step 80 from step 78. AudioCard Interface 26 then calculates for each band the remaining coefficient values. AudioCard Interface 26 uses Relationship 3, set forth above, to calculate the value of the first tuning coefficient, $k_1$. AudioCard Interface 26 calculates values for the first and second filter coefficients, $c_1$ and $c_2$, using Relationships 5 and 6 respectively, also set forth above. Finally, during step 82 AudioCard Interface 26 passes to Filter Interface 32 the values for G, $k_1$, $k_2$, $c_1$ and $c_2$ for each band.

D. Insuring Continued Operation of the Parametric Equalizer During Real-Time Changes to Parameter Values AudioCard Interface 26 and its equalizer interface may be designed to permit computer users to modify equalizer parameters in real-time. Such modification requires some caution to insure that parametric equalizer 23 continues to operate in the face of significant changes to cut/boost values. Investigation reveals that parametric equalizer 23 may cease functioning when significant changes are made to a band's cut/boost value. As used herein, a change is considered significant when a band switches from boosting a signal to cutting it, and vice versa. The signal flow diagram of FIG. 1 indicates why significant changes in G cause such havoc in parametric equalizer operation. The values of two internal nodes, $w_5$ and $w_3$, are delayed versions of other nodes, $w_4$ and $w_2$, respectively. Thus, during the first calculation cycle following a significant change in G, $w_5$ and $w_3$ are effectively using a value of G different from that being used by nodes $w_4$ and $w_2$.

Figure 10:
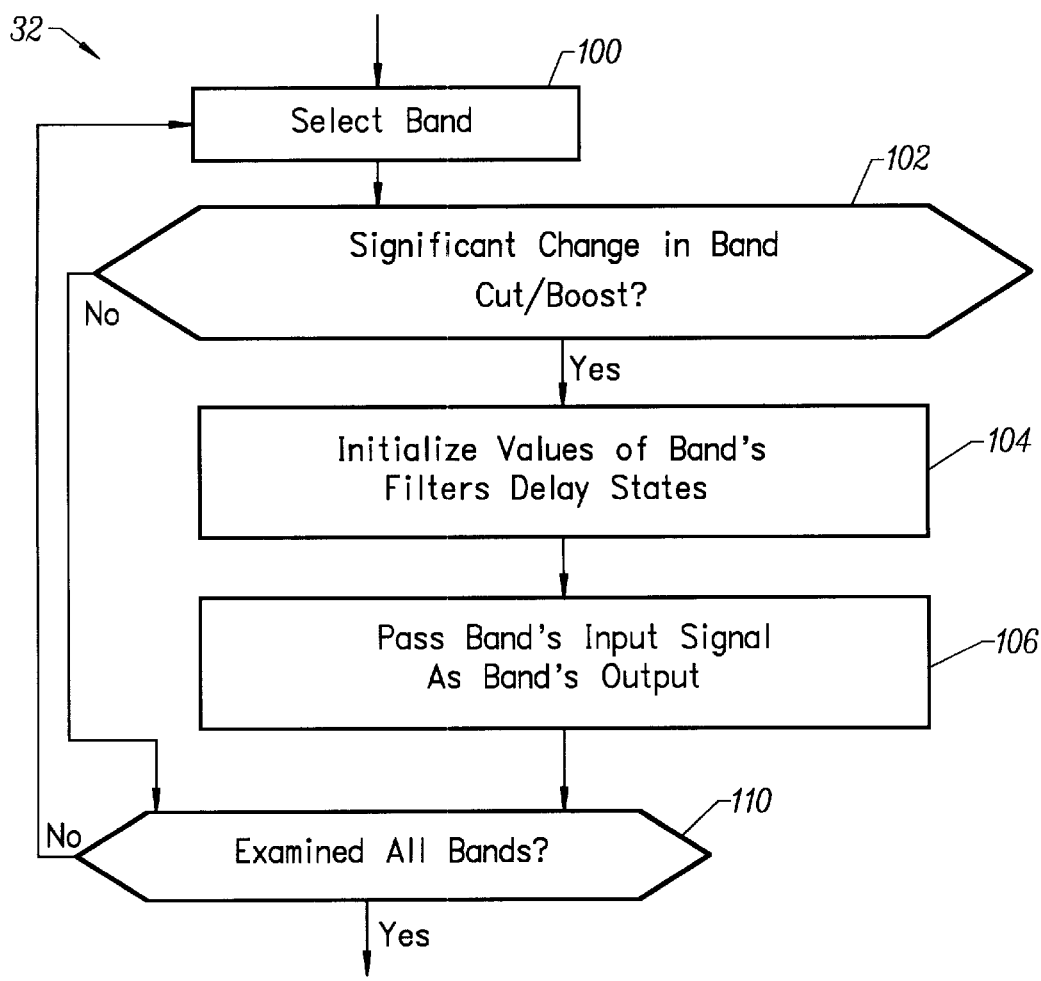
FIG. 10 is a flow diagram of the instructions of the Filter Interface to insure the parametric equalizer continues to operate during significant, real-time modification of any band's cut/boost parameter value.

Filter Interface 32 can be modified to insure that the parametric equalizer 23 continues to function in the face of a significant real-time change in the G value for any band. FIG. 10 illustrates in flow diagram form instructions of Filter Interface 32. First, during step 100 Filter Interface 32 selects a band for examination. Next, during step 102 Filter Interface 32 determines whether there has been a significant change in the value of the cut/boost parameter for the selected band. Any number of methods can be used to determine whether a band that was previously boosting is now to cut, or vice versa. Preferably, during step 102 Filter Interface 32 simply determines whether the G value just received from AudioCard Interface 26 is equal to 1. If G=1, then Filter Interface 32 considers the cut/boost change significant and branches to step 104.

Filter Interface 32 takes two steps to insure that the filter continues to operate despite the significant change in cut/boost value. First, during step 104 Filter Interface initializes the values of those internal nodes whose values are generally based upon previous values of other internal nodes. Thus, for the signal flow diagram of FIG. 1, during step 104 Filter Interface 32 sets to 0 the values for internal nodes $w_5$ and $w_3$. Second, during step 106, Filter Interface 32 notifies Filter 30 that the filters for the selected band should be bypassed. In other words, for this cycle the selected band's filters should output the value presented to them as their input.

If Filter Interface 32 determines during step 102 that the change to the cut/boost value is not significant, then no action need be taken. In this case, Filter Interface 32 advances to step 110 from step 102.

During step 110 Filter Interface 32 determines whether it has examined the cut/boost values for each band. If not, Filter Interface 32 returns to step 100.

E. Conclusion

Thus, an improved digital parametric equalizer having symmetrical cut and boost spectrums has been described. This symmetry is achieved by using two different Relationships to calculate the value of the second tuning coefficient, $k_2$. One Relationship is used when an equalizer band is to boost and the other Relationship is used when the equalizer band is to cut the input signal. The improved digital parametric equalizer described more closely achieves ideal performance and increases the ability to notch out undesired audio frequencies.

In the foregoing specification, the invention has been described with reference to specific exemplary embodiments thereof. It will, however, be evident that various modifications and changes may be made thereto without departing from the broader spirit and scope of the invention as set forth in the appended claims. Accordingly, the specification and drawings are to be regarded in an illustrative rather than a restrictive sense.

What is claimed is:

1. A computer readable memory to direct a computer to function in a specified manner, comprising:

a first set of instructions to determine a value of a tuning coefficient based upon whether a parametric equalizer is to cut or to boost an input signal; and a second set of instructions to implement a filter to realize the parametric equalizer, the second set of instructions using the value of the tuning coefficient and the input signal to produce an output signal having substantially symmetrical cut and boost spectrums.

2. The computer readable memory of claim 1 wherein the first set of instructions comprise:

a third set of instructions to calculate the value of the tuning coefficient using a boost Relationship when the parametric equalizer is to boost the input signal; and a fourth set of instructions to calculate the value of the tuning coefficient using a cut Relationship when the parametric equalizer is to cut the input signal.

3. The computer readable memory of claim 2 wherein:

a value of a cut/boost parameter of the parametric equalizer is a variable in the cut Relationship used by the fourth set of instructions and the value of the cut/boost parameter is not a variable in the boost Relationship used by the third set of instructions.

4. The computer readable memory of claim 1 further comprising:
a fifth set of instructions to enable a user of the computer to change parameters of the parametric equalizer in real-time, the parameters including a cut/boost parameter.

5. The computer readable memory of claim 4 further comprising:
a sixth set of instructions to insure that the parametric equalizer continues to function during a significant change in a value of the cut/boost parameter.

6. The computer readable memory of claim 5 wherein:
the second set of instructions to implement the filter uses a previous value of a first filter variable to determine a current value of a second filter variable, the current values of the first and the second filter variables being used to produce the output signal; and
wherein the sixth set of instructions include:
a seventh set of instructions to set the current value of the second filter variable to a first value when the value of the cut/boost parameter has significantly changed, the first value not being equal to the previous value of the first filter variable.

7. The computer readable memory of claim 3 further comprising:
a fifth set of instructions to enable a user of the computer to change the parameters of the parametric equalizer in real-time.

8. The computer readable memory of claim 7 wherein:
a sixth set of instructions to insure that the parametric equalizer continues to function during a significant change in the value of the cut/boost parameter.

9. The computer readable memory of claim 8 wherein:
the second set of instructions to implement the filter uses a previous value of a first filter variable to determine a current value of a second filter variable, the current values of the first and the second filter variables being used to produce the output signal; and
wherein the sixth set of instructions include:
a seventh set of instructions to set the current value of the second filter variable to a first value when the value of the cut/boost parameter has significantly changed, the first value not being equal to the previous value of the first filter variable.

10. A method of realizing a parametric equalizer using a digital filter, parameters of the parametric equalizer including a cut/boost parameter, the method being implemented by a computer executing instructions stored in a memory, the instructions comprising the steps of:
a) calculating a value for a first tuning coefficient;
b) using a boost Relationship to determine a value of a second tuning coefficient when a value of the cut/boost parameter is greater than one;
c) using a cut Relationship to determine the value of the second tuning coefficient when the value of the cut/boot parameter is less than one; and
d) generating an output signal given an input signal and the first and the second tuning coefficients, the output signal having a substantially equivalent bandwidth regardless of whether the value of the cut/boost parameter is greater than one or less than one.

11. The method of claim 10 wherein the cut/boost parameter is a variable in the cut Relationship and the cut/boost parameter is not a variable in the boost Relationship.

12. The method of claim 11 further comprising the steps of:
e) changing the value of the cut/boost parameter; and
f) repeating steps a) through d).

13. The method of claim 11 wherein step d) further comprises:
d1) using a previous value of a first filter variable to determine a current value of a second filter variable, the current values of the first and the second filter variables being used to produce the output signal; and
wherein the method further comprises the steps of:
g) determining whether a change in the value of the cut/boost parameter is significant; and
h) setting the current value of the second filter variable to a first value when the change in the value of the cut/boost parameter is significant, the first value not being equal to the previous value of the first filter variable.

14. A method of implementing a parametric equalizer using a four-multiply normalized ladder digital filter, parameters of the parameter equalizer including a cut/boost parameter, the method being implemented by a computer executing instructions stored in a memory, the instructions comprising the steps of:
a) calculating a value for a tuning coefficient based upon whether the parametric equalizer is to cut or to boost an input signal; and
b) responding to the value of the tuning coefficient and the input signal to produce an output signal having substantially symmetrical cut and boost spectrums.

* * * * *